United States Patent
Mao et al.

(10) Patent No.: US 8,315,019 B1
(45) Date of Patent: Nov. 20, 2012

(54) METHOD AND SYSTEM FOR PROVIDING AN IMPROVED MAGNETORESISTIVE STRUCTURE UTILIZING AN OXIDATION BUFFER LAYER

(75) Inventors: Ming Mao, Pleasanton, CA (US); Wei Zhang, Fremont, CA (US); Mahendra Pakala, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 698 days.

(21) Appl. No.: 12/414,880

(22) Filed: Mar. 31, 2009

(51) Int. Cl.
*G11B 5/127* (2006.01)

(52) U.S. Cl. .................. 360/320; 360/319; 360/324.11; 360/324.12; 428/814; 428/815

(58) Field of Classification Search .......... None
See application file for complete search history.

(56) References Cited

U.S. PATENT DOCUMENTS

| | | | |
|---|---|---|---|
| 5,350,629 A | 9/1994 | Chaug et al. | |
| 6,780,524 B2 | 8/2004 | Lin et al. | |
| 7,042,684 B2 | 5/2006 | Horng et al. | |
| 7,264,974 B2 | 9/2007 | Horng et al. | |
| 7,394,625 B2 | 7/2008 | Horng et al. | |
| 7,623,324 B2 * | 11/2009 | Honda et al. | 360/324.12 |
| 7,652,857 B2 * | 1/2010 | Sato | 360/324.12 |
| 2002/0191354 A1 * | 12/2002 | Yoshikawa et al. | 360/324.1 |
| 2005/0170532 A1 | 8/2005 | Horng et al. | |
| 2006/0018057 A1 | 1/2006 | Huai | |
| 2006/0162148 A1 | 7/2006 | Horng et al. | |
| 2006/0181815 A1 | 8/2006 | Horng et al. | |
| 2007/0047153 A1 | 3/2007 | Zeltser | |
| 2007/0111332 A1 | 5/2007 | Zhao et al. | |
| 2007/0298284 A1 | 12/2007 | Horng et al. | |

FOREIGN PATENT DOCUMENTS

WO 03083910 A1 10/2003
WO 2008073760 A1 6/2008

OTHER PUBLICATIONS

Symposium E: Integration Challenges in Next-Generation Oxide-Based Nanoelectronics, Materials Research Society Spring Meeting, San Francisco, CA, Apr. 14-15, 2004, pp. 108-118.

* cited by examiner

*Primary Examiner* — Kevin Bernatz

(57) ABSTRACT

A method and system for providing a magnetic transducer is described. The method and system include providing a magnetoresistive structure having a plurality of sides. At least one oxidation buffer layer covers at least the plurality of sides. The method and system also include providing at least one oxide layer after the oxidation buffer layer is provided. The oxide layer(s) reside between the sides and the oxidation buffer layer(s).

11 Claims, 6 Drawing Sheets

METHOD AND SYSTEM FOR PROVIDING AN IMPROVED MAGNETORESISTIVE STRUCTURE UTILIZING AN OXIDATION BUFFER LAYER

BACKGROUND

FIG. 1 depicts a conventional method 10 for forming a read transducer. The conventional method 10 commences after the conventional magnetoresistive stack has been formed. The magnetoresistive stack typically includes a conventional antiferromagnetic (AFM) or pinning layer, a conventional pinned layer, a conventional spacer layer, and a conventional free layer. The magnetoresistive stack is typically formed on other structures, such as, shield(s), and/or write transducer(s). A conventional magnetoresistive sensor is defined in the track width direction from the conventional magnetoresistive stack, via step 12. Step 12 typically includes covering a portion of the magnetoresistive stack with a mask and ion milling the exposed portion of the stack. Thus, the conventional magnetoresistive sensor in a read transducer is defined in the track width direction using step 12. The track width direction is parallel to the air-bearing surface (ABS) and generally perpendicular to the layers of the magnetoresistive stack.

The magnetoresistive sensor is oxidized, typically by direct exposure to an oxidant such as ozone ($O_3$), oxygen, or an oxygen plasma, via step 14. Exposure to the oxidant in step 14 allows formation of an oxide layer on the sides of the conventional magnetoresistive sensor. Typically, this oxide layer is formed to a thickness of greater than ten Angstroms within a few seconds of exposure to ozone. Formation of the oxidation layer is desirable for passivation of the sides of the conventional magnetoresistive sensor. In particular, damage created by the ion mill that defines the magnetoresistive junction may be repaired and redeposition oxidized to prevent shorting.

After oxidation, a conventional insulating layer, such as aluminum oxide, is provided, via step 16. The oxide layer formed in step 14 resides between the aluminum oxide layer and the conventional magnetoresistive sensor. Hard bias structures for biasing the magnetoresistive junction are then provided adjacent to the conventional insulating layer. The hard bias structures are used to magnetically bias the conventional magnetoresistive sensor. Fabrication of the device may then be completed, for example by formation of additional shields, contacts, write transducers, and/or other structure.

FIG. 2 depicts an ABS view of a conventional magnetic read transducer 20 used in reading a media (not shown) and fabricated using the conventional method 10. For clarity, only a portion of the conventional read transducer 20 is shown. Referring to FIGS. 1-2 the conventional read transducer 20 is shown after completion of step 18 of the conventional method 10. The conventional magnetic transducer 20 is formed on substrate 22 and includes conventional magnetoresistive sensor, 30. The substrate 22 may be a shield. The conventional magnetoresistive sensor 30 includes a conventional AFM layer 32, a pinned layer 34, a spacer layer 42, a free layer 44 and a capping layer 46. The pinned layer 34 is a synthetic antiferromagnet including ferromagnetic layers 36 and 40 separated by a thin nonmagnetic spacer layer 38. Typically, the ferromagnetic layers 36 and 40 are antiferromagnetically coupled. The spacer layer 42 may be conductive or an insulating tunneling barrier layer. Also shown are oxide layers 24A and 24B formed by oxidizing the sensor 30, insulating layers 26A and 26B, and hard bias structures 28A and 28B.

BRIEF SUMMARY OF THE INVENTION

A method and system for providing a magnetic transducer is described. The method and system include providing a magnetoresistive structure having a plurality of sides. At least one oxidation buffer layer covers at least the plurality of sides. The method and system also include providing at least one oxide layer after the oxidation buffer has been provided. The oxide layer(s) reside between the sides and the oxidation buffer layer(s).

DETAILED DESCRIPTION OF THE PREFERRED EMBODIMENTS

Figure 1:
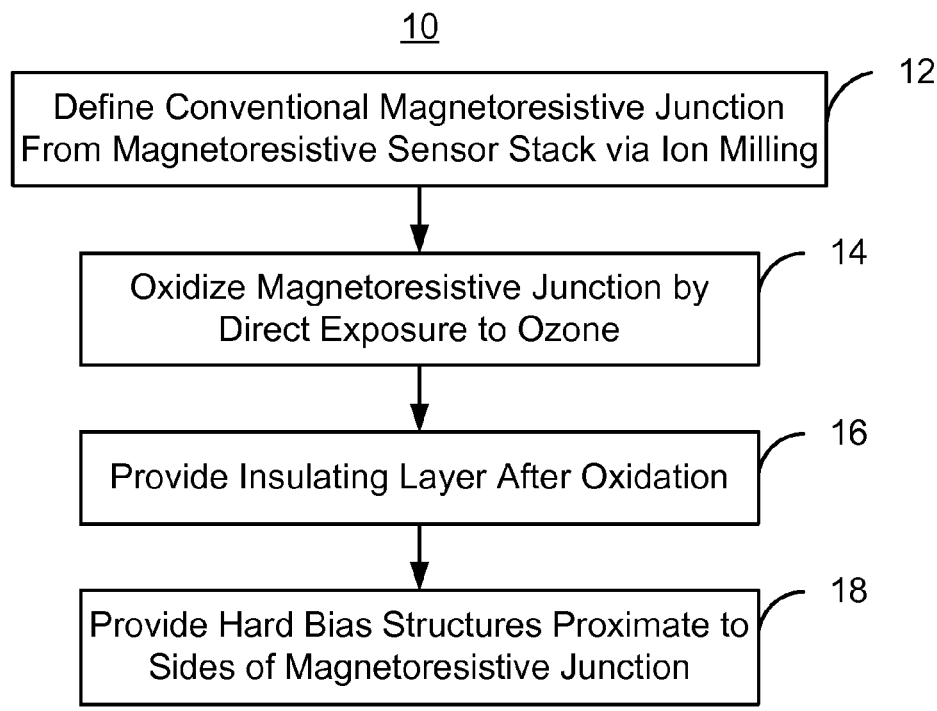
FIG. 1 is a flow chart depicting a conventional method for fabricating a read transducer.
Figure 2:
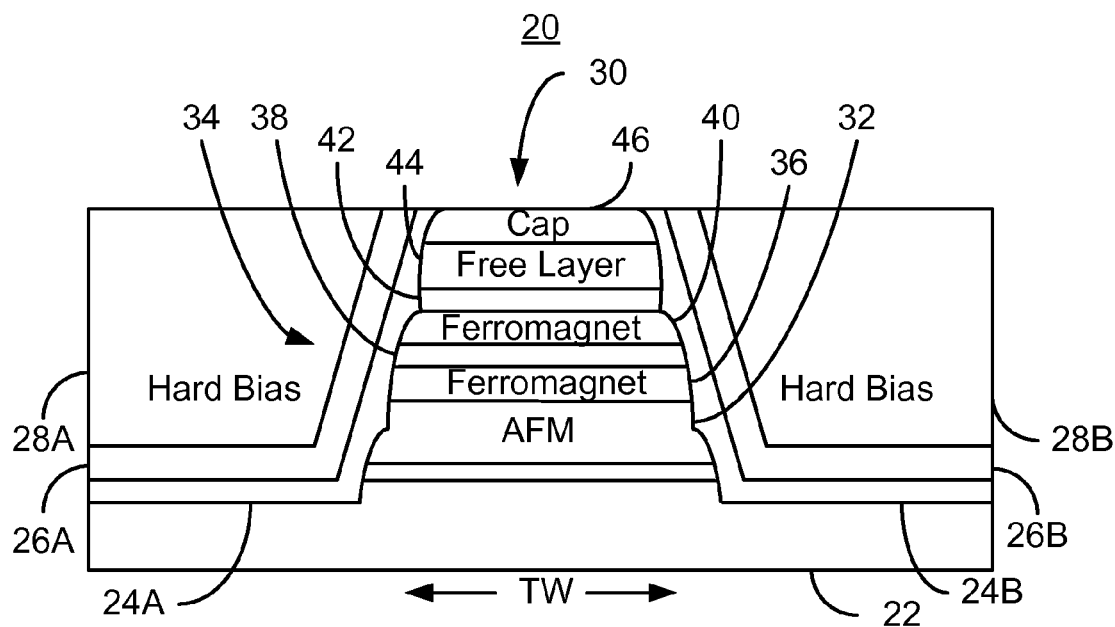
FIG. 2 depicts an ABS view of a conventional read transducer.

As discussed above, the conventional method 10 allows fabrication of the conventional magnetic transducer 20. However, it has been found that the method 10 results in poor yield. In addition, there may be variations in the physical, electric, and magnetic track width (TW) and read performance instability. It has been determined that these issues may be due to variations in the magnetic and physical track width of the conventional magnetoresistive sensor and in physical separation between the read sensor and the hard bias. As can be seen in FIG. 2, the conventional magnetoresistive sensor 30 has various layers 32, 36, 38, 40, 42, 44, and 46. These layers 32, 36, 38, 40, 42, 44, and 46 are heterogeneous in nature and thus may have different oxidation rates. As a result, the layers 32, 36, 38, 40, 42, 44, and 46 may be oxidized to a different depth. Consequently, the layers 32, 36, 38, 40, 42, 44, and 46 may vary significantly in width. In addition, the distance between layers, such as the free layer 44 and the hard bias structures 28A and 28B, may vary greatly. Consequently, yield and performance may be adversely affected. Further, mechanisms such as reducing the concentration of the oxidant may not be sufficient to improve yield and performance.

Figure 3:
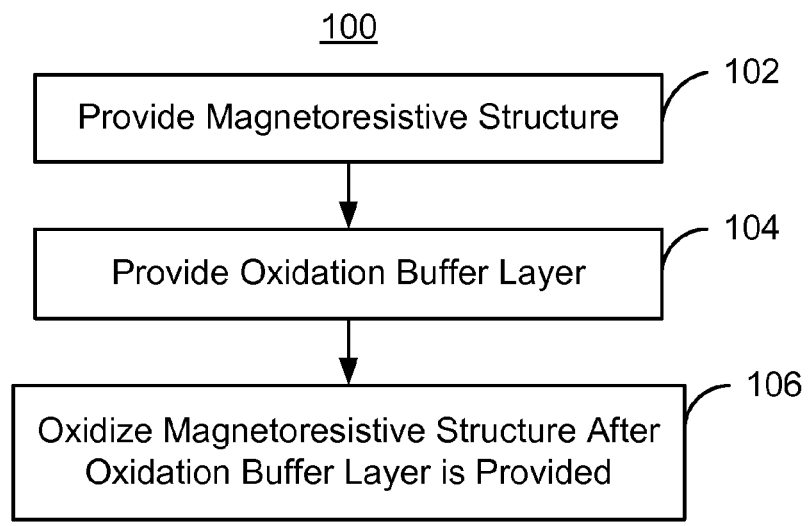
FIG. 3 is a flow chart depicting an exemplary embodiment of a method for fabricating a read transducer.

FIG. 3 is a flow chart of an exemplary embodiment of a method 100 for fabricating a magnetoresistive structure, particularly a magnetoresistive sensor in a read transducer. For simplicity, some steps may be omitted or combined with other steps. The method 100 also may commence after formation of other structures of the read transducer. The method 100 is also described in the context of providing a single magnetoresistive structure. However, the method 100 may be used to fabricate multiple structures at substantially the same time. The method 100 is also described in the context of particular layers. However, in some embodiments, such layers may include sub-layer(s). The method 100 is also described in the context of the sides of the magnetoresistive sensor formed in the track width direction. However, the method 100 may be used in connection with oxidizing other portions of the magnetoresistive sensor.

The magnetoresistive structure is provided, via step 102. In one embodiment, step 102 includes providing a magnetoresistive stack, for example by blanket depositing the layers. A pinning layer such as an AFM layer, a pinned layer, a nonmagnetic spacer layer, and a free layer may have been deposited. The pinned layer may be a synthetic antiferromagnetic (SAF) layer including magnetically coupled ferromagnetic sublayers interleaved with nonmagnetic layer(s). The nonmagnetic spacer layer may be an insulating barrier layer, a conductive layer, or another analogous layer. The free layer is magnetic and has a magnetization that may change in response to the field of a media (not shown). The free layer may be a multilayer. Step 102 also includes defining the magnetoresistive structure is defined in the track width direction. In one embodiment a portion of the magnetoresistive stack is covered by a mask, while the exposed portion is removed via an ion mill. The track width direction is parallel to the ABS and generally perpendicular to the layers of the magnetoresistive stack. However, in devices such as a transducer, the magnetoresistive structure may still extend in the stripe height direction, perpendicular to the ABS, farther than desired in the final device.

An oxidation buffer layer is provided, via step 104. This oxidation buffer layer resides at least on the sides of the magnetoresistive structure. In one embodiment, a portion of the oxidation buffer layer may also reside on the portion of the device underlying the magnetoresistive structure and adjacent to the magnetoresistive structure. The oxidation buffer layer provided in step 104 is sufficiently thin that the underlying magnetoresistive structure may still be oxidized and sufficiently thick that the oxidation rate is slowed. In addition, the oxidation buffer layer may be conformal, adhering to the sides of the magnetoresistive structure. In one embodiment, the oxidation buffer layer is deposited, for example using atomic layer deposition (ALD). Step 104 may include depositing a layer including one or more of aluminum oxide, tantalum oxide, titanium oxide, magnesium oxide, silicon oxide, and silicon nitride. The thickness of the oxidation buffer layer deposited in step 104 may vary depending upon the material used. However, the oxidation buffer layer is generally desired to be thin. In one embodiment, the oxidation buffer layer has a thickness of at least two monolayers. In one such embodiment, the thickness is not more than seven monolayers. In another embodiment, the thickness is not more than five monolayers.

The magnetoresistive structure is oxidized after the oxidation buffer layer is provided, via step 106. In one embodiment, step 106 includes exposing the device to an oxidant such as ozone. In another embodiment, step 106 may include exposing the device to oxygen or an oxygen plasma. In step 106, the oxidant traverses the oxidation buffer layer to oxidize the sides of the underlying magnetoresistive structure. Fabrication of the device incorporating the magnetoresistive structure may be completed after, for example, hard bias structures, a write transducer and/or other structures may be formed.

Figure 4:
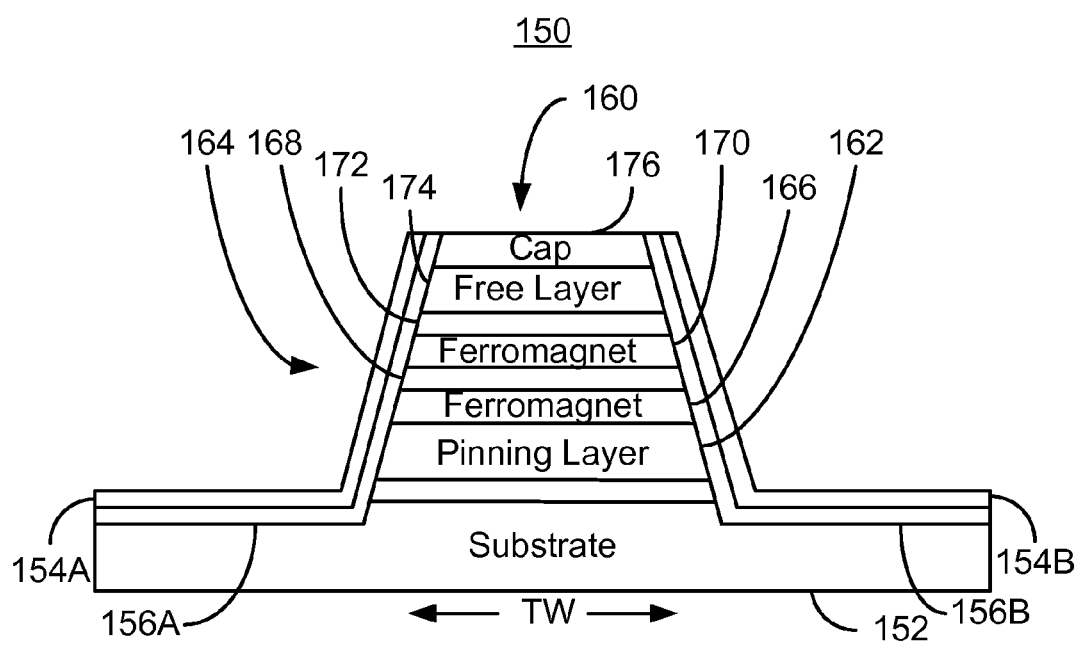
FIG. 4 depicts an exemplary embodiment of a magnetoresistive structure.

FIG. 4 depicts an exemplary embodiment of a device 150 incorporating a magnetoresistive structure 160. The device 150 may be a read transducer that itself may be part of a merged head that also includes a write transducer (not shown) and resides on a slider (not shown) of a disk drive. For clarity, the FIG. 4 is not drawn to scale. Referring to FIGS. 3-4, the device 150 may be formed using the method 100. However, in an alternate embodiment, the device 150 may be formed in another manner. The magnetoresistive structure includes a pinning layer 162, a pinned layer 164, a spacer layer 172, a free layer 174 and, in the embodiment shown, and a capping layer 176. In one embodiment, the pinned layer 164 is a SAF including ferromagnetic layers 166 and 170 separated by nonmagnetic spacer layer 168. The nonmagnetic spacer layer 168 may have its thickness set such that the ferromagnetic layers 166 and 170 are antiferromagnetically coupled. The magnetization of the pinned layer 164 is set, or pinned, by the pinning layer 162. The spacer layer 172 may be conductive, an insulating barrier layer, or another analogous layer. The free layer 174 has a magnetization (not shown) that may respond to an external magnetic field. In addition, the magnetoresistive structure 160 may include additional layers (not shown). For example, an additional spacer layer, an additional pinned layer and an additional pinning layer between the free layer and the capping layer may be provided. Thus, a dual magnetoresistive structure may be formed.

The device 150 also includes oxide layers 156A and 156B and oxidation buffer layers 154A and 154B. Although shown as separate, the oxide layers 156A and 156B may be formed together through the oxidation in step 106. Similarly, although shown as separate, the oxidation buffer layers 154A and 154B may be deposited in a single step. The oxidation buffer layers 154A and 154B are provided in step 104, while the oxide layers 156A and 156B may be provided in step 106 of the method 100. Although deposited first, the oxidation buffer layers 154A and 154B are shown as on the oxide layers 156A and 156B. This placement is because in step 106, the oxidant traverses the buffer layers 154A and 154B to oxidize the underlying magnetoresistive structure 160 and form oxide layers 156A and 156B.

The oxidation buffer layers 154A and 154B are thin and may be conformal. The oxidation buffer layers 154A and 154B reside not only on the sides of the magnetoresistive structure 160 but also on the surface of the substrate 152. In one embodiment, the oxidation buffer layers 154A and 154B include one or more of aluminum oxide, tantalum oxide, titanium oxide, magnesium oxide, silicon oxide, and silicon nitride. The thickness of the oxidation buffer layers 154A and 154B may vary depending upon the material used. However, the oxidation buffer layers 154A and 154B are generally desired to be thin. In one embodiment, each of the oxidation buffer layers 154A and 154B has a thickness of at least two monolayers. In one such embodiment, the thickness is not more than seven monolayers. In another embodiment, the thickness is not more than five monolayers.

Because of the presence of the oxidation buffer layers 154A and 154B, oxidation in step 106 may be slowed. In addition, growth of the oxide layers 156A and 156B in step 106 may be more uniform. Better control of the oxide layers 156A and 156B may be achieved. As a result, the profile of the sidewalls of the magnetoresistive structure 160 is smoother and more uniform. Consequently, variations in physical and magnetic track width (TW) of the magnetoresistive structure 160 may be reduced and magnetic track width better controlled. In addition, the separation between the magnetoresistive structure 160 and structure(s) adjacent to the oxidation buffer layers 154A and 154B may be more uniform and better controlled. Consequently, yield for the method 100 and performance of the magnetoresistive structure 160 may be improved.

Figure 5:
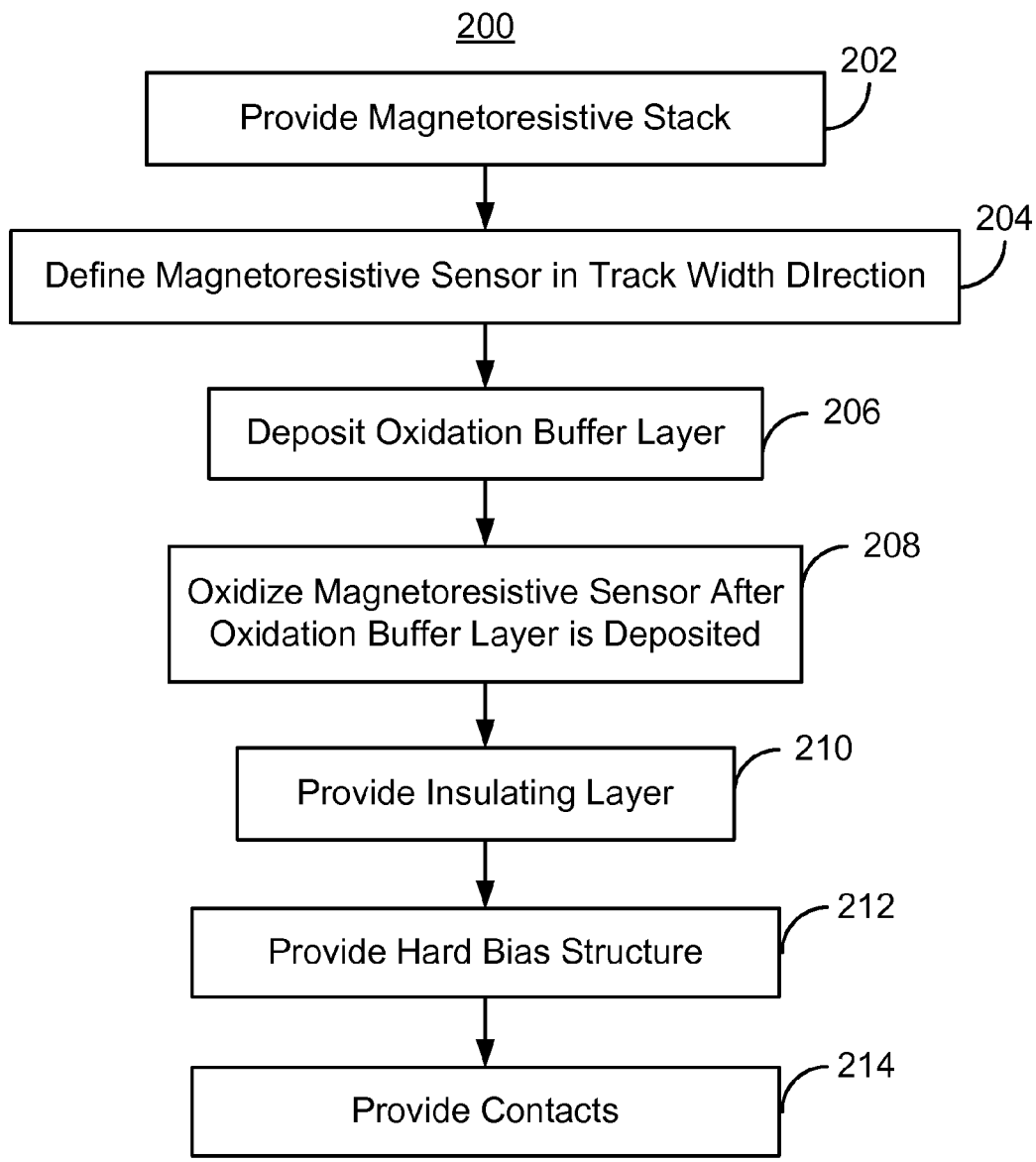
FIG. 5 is a flow chart of another exemplary embodiment of a method for fabricating a magnetic transducer.

FIG. 5 is a flow chart of another exemplary embodiment of a method 200 for fabricating a magnetic transducer. For simplicity, some steps may be omitted or combined with other steps. The method 200 also may commence after formation of other structures of the read transducer. FIGS. 6-10 depict an exemplary embodiment of a magnetic recording transducer 250 during fabrication. The magnetic transducer 250 is a read transducer may be part of a merged head that also includes a write transducer (not shown) and resides on a slider (not shown) of a disk drive. The magnetic transducer 250 may also include other structures that are not shown. For clarity, the magnetic recording transducer 250 is not drawn to scale.

Referring to FIGS. 5-10, the method 200 is described in the context of a single magnetic transducer 250. However, the method 200 may be used to fabricate multiple structures at substantially the same time. The method 200 and transducer 250 are also described in the context of particular layers. However, in some embodiments, such layers may include sub-layer(s). The method 200 is also described in the context of the sides of the magnetoresistive sensor formed in the track width direction. However, the method 200 may be used in connection with oxidizing other portions of the magnetoresistive sensor.

A magnetoresistive stack is provided, preferably by blanket depositing the layers, via step 202. For example, an AFM layer, a pinned layer, a nonmagnetic spacer layer, and a free layer may have been deposited. The pinned layer may be a SAF. The nonmagnetic spacer layer may be an insulating barrier layer, a conductive layer, or another similar layer. The free layer is magnetic and has a magnetization that may change in response to the field of a media (not shown). The free layer may also be a multilayer.

The magnetoresistive sensor is defined in the track width direction, via step 204. The track width direction is parallel to the ABS and generally perpendicular to the layers of the magnetoresistive stack. In one embodiment, the magnetoresistive stack is ion milled. Consequently, there may be redeposition and/or damage to the magnetoresistive sensor stack.

Figure 6:
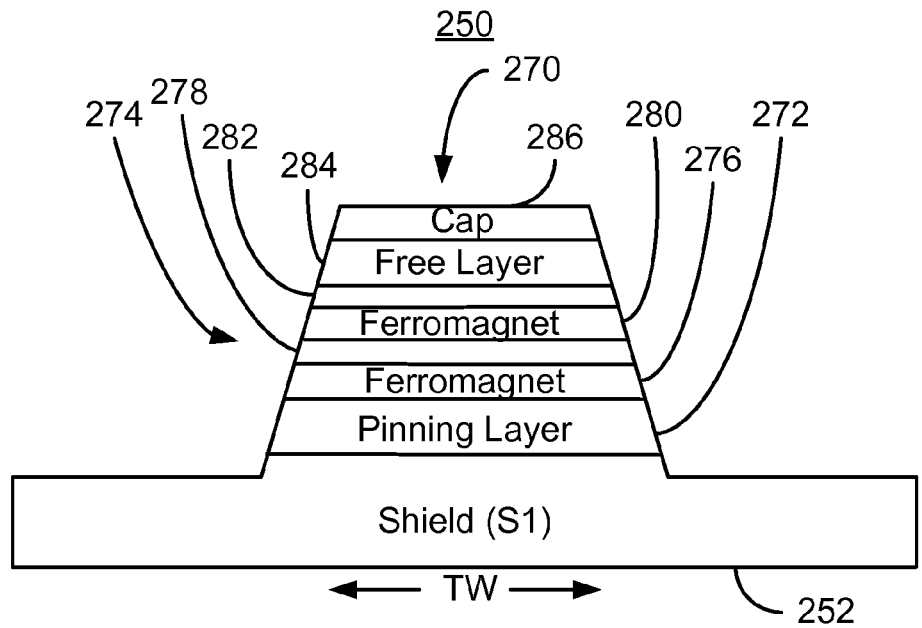
FIGS. 6-10 depict an exemplary embodiment of a magnetic recording transducer during fabrication.

FIG. 6 depicts the magnetic transducer 250 after step 204 is performed and as seen from an ABS location. The ABS location is the location at which the ABS will be positioned in the final device. In addition, mask(s) that may be used in defining the track width are not shown. The magnetic transducer 250 includes a magnetoresistive sensor 270 defined in step 154. The magnetoresistive sensor 270 is formed on a shield 252. The shield 252 may also be used as a contact to drive current in a current-perpendicular-to-plane (CPP) direction. The magnetoresistive sensor 270 is defined in the track width direction and thus has track width TW. The magnetoresistive sensor includes a pinning layer 272 that may be an AFM layer, a pinned layer 274, a spacer layer 272, a free layer 284 and a capping layer 286. In one embodiment, the pinned layer 164 is a SAF including ferromagnetic layers 276 and 280 separated by nonmagnetic spacer layer 278. The nonmagnetic spacer layer 278 may have its thickness set such that the ferromagnetic layers 276 and 280 are antiferromagnetically coupled. The magnetization of the pinned layer 274 is set, or pinned, by the pinning layer 272. The spacer layer 282 may be conductive, an insulating barrier layer, or another analogous layer. The free layer 284 has a magnetization (not shown) that may respond to an external magnetic field. In addition, the magnetoresistive sensor 270 may include additional layers (not shown). For example, an additional spacer layer an additional pinned layer and an additional pinning layer between the free layer and the capping layer may be provided. Thus, a dual magnetoresistive structure may be formed.

An oxidation buffer layer is deposited, via step 206. This oxidation buffer layer resides at least on the sides of the magnetoresistive structure. In one embodiment, a portion of the oxidation buffer layer may also reside adjacent to the magnetoresistive structure. The oxidation buffer layer provided in step 206 is sufficiently thin that the underlying magnetoresistive structure may still be oxidized and sufficiently thick that the oxidation rate is slowed. In addition, the oxidation buffer layer may be conformal, adhering to the sides of the magnetoresistive structure. In one embodiment, the oxidation buffer layer is deposited using ALD.

Figure 7:
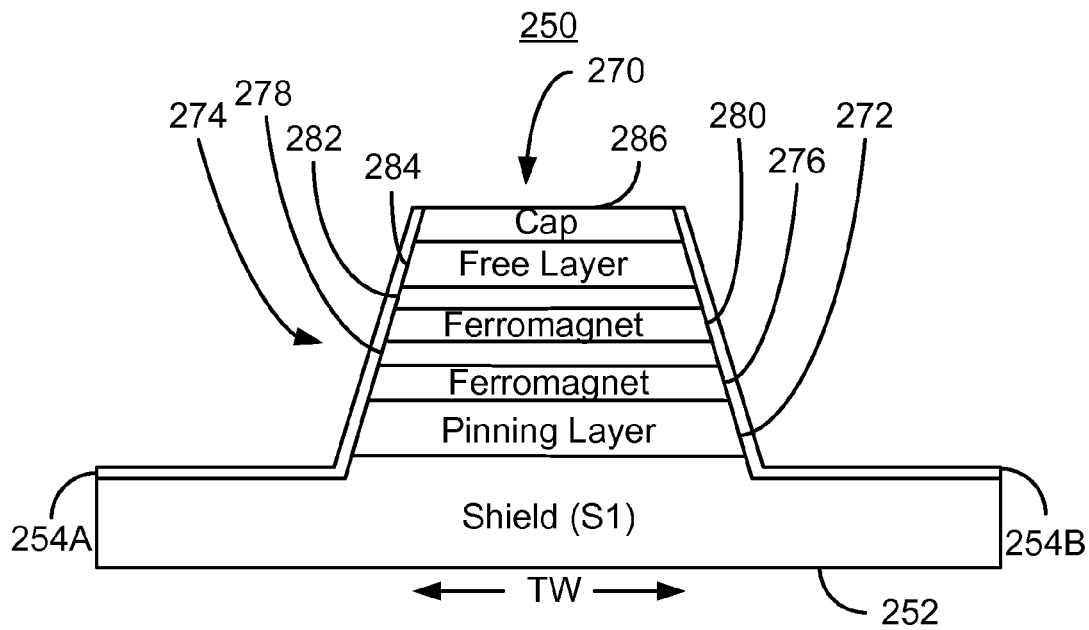

FIG. 7 depicts the transducer 250 after step 206 is performed. Thus, the transducer 250 includes oxidation buffer layers 254A and 254B. Although shown as separate, the oxidation buffer layers 254A and 254B may be deposited in a single step. The oxidation buffer layers 254A and 254B may include depositing a layer including one or more of aluminum oxide, tantalum oxide, titanium oxide, magnesium oxide, silicon oxide, and silicon nitride. The thickness of the oxidation buffer layers 254A and 254B may vary depending upon the material used. In one embodiment, each of the oxidation buffer layers 254A and 254B has a thickness of at least two monolayers. In one such embodiment, the thickness is not more than seven monolayers. In another embodiment, the thickness is not more than five monolayers.

The magnetoresistive structure is oxidized after the oxidation buffer layer is deposited, via step 208. In one embodiment, step 208 includes exposing the device to an oxidant such as ozone. In step 208, the oxidant traverses the oxidation buffer layer to oxidize the sides of the underlying magnetoresistive structure.

An insulating layer is provided, via step 210. In one embodiment, step 210 includes depositing the insulating layer using ALD. In one embodiment, the thickness of the insulating layer is a desired thickness of the insulating layer minus the thickness of the oxidation buffer layers 154A and 154B. The insulating layer may include materials such as aluminum oxide.

Figure 8:
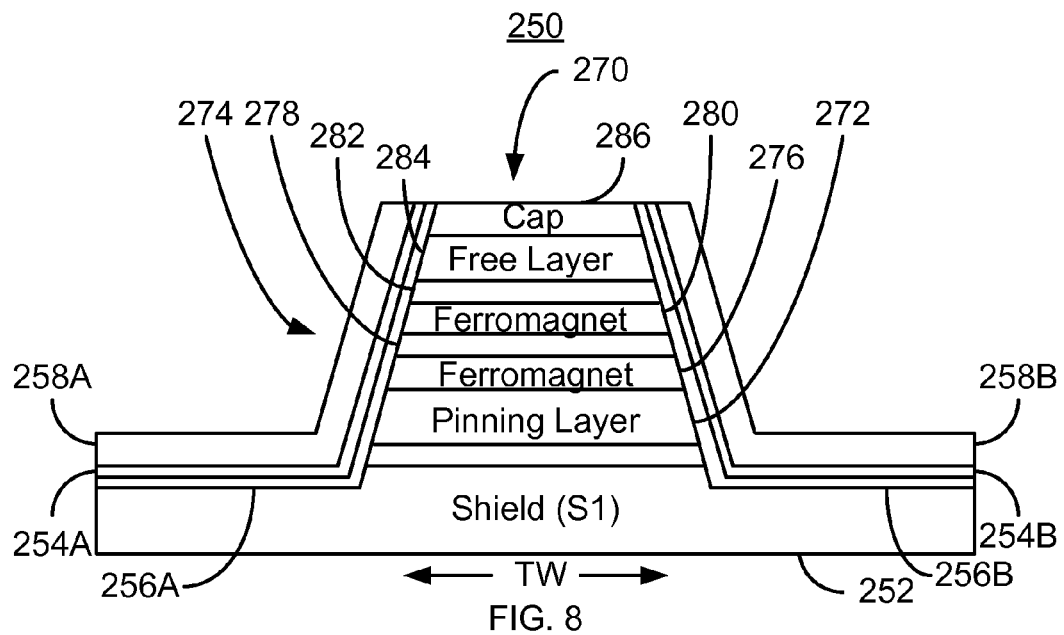

FIG. 8 depicts the transducer 250 after step 210 is performed. Thus, the transducer 250 includes oxide layers 256A and 256B, oxidation buffer layers 254A and 254B, as well as insulating layers 258A and 258B. Although shown as separate, the oxide layers 256A and 256B may be formed together. Similarly, the insulating layers 258A and 258B may be deposited in a single step. Although deposited first, the oxidation buffer layers 254A and 254B are shown as on the oxide layers 256A and 256B. This placement is because in step 208, the oxidant traverses the buffer layers 254A and 254B to oxidize the underlying magnetoresistive sensor 270. In addition, although depicted separately, the oxidation buffer layer 254A/254B and the insulating layer 258A/258B may be made of the same material. In such an embodiment, the layers 254A/254B and 258A/258B may be considered to merge into a single layer.

Figure 9:
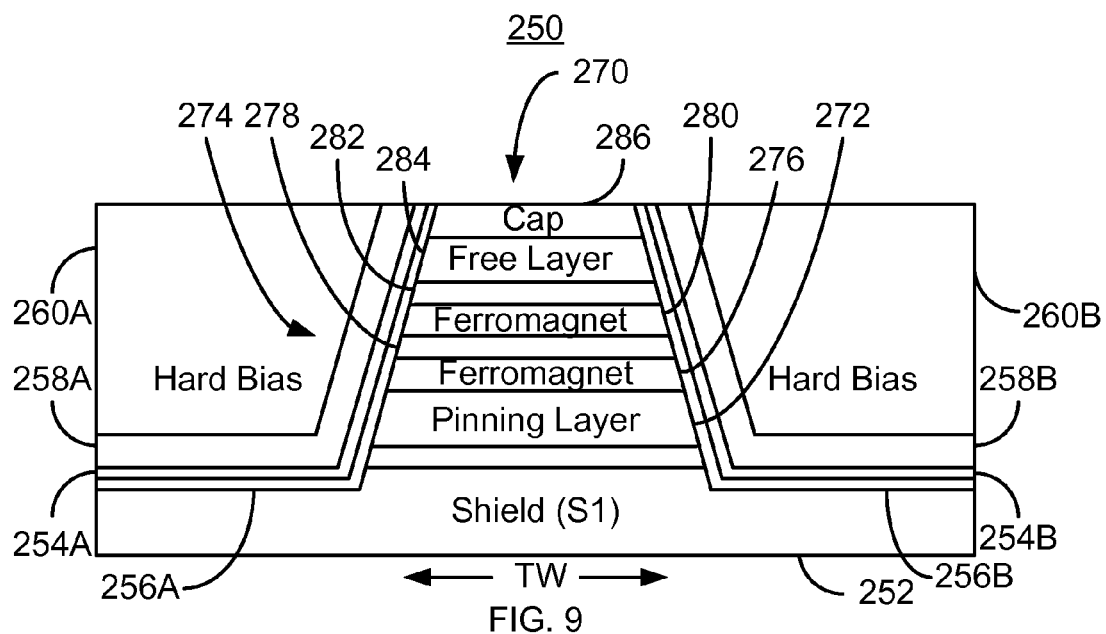

Hard bias structure(s) are provided, via step 212. In one embodiment, step 212 includes depositing a high coercivity material. FIG. 9 depicts the magnetic transducer after step 212 is provided. Thus, hard bias structures 260A and 260B are shown. Although depicted as separate, the hard bias structures 260 may be formed concurrently.

Figure 10:
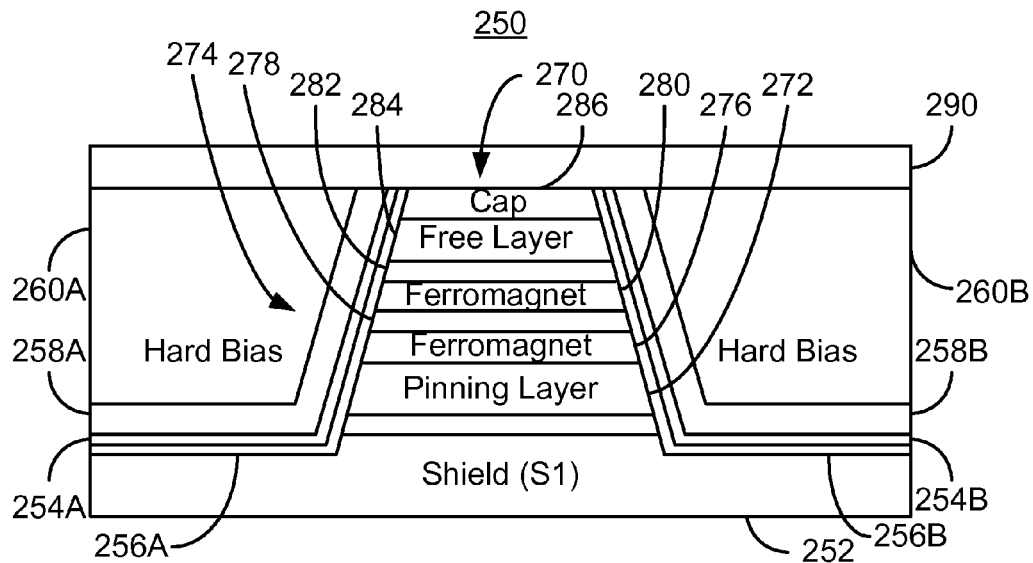

Contacts for the magnetic transducer 250 may be provided, via step 214. In one embodiment, the shield 252 is the bottom contact and has already been provided. Thus, at least the top contact may be provided. FIG. 10 depicts the magnetic transducer 205 after step 214 is performed. Thus, a top contact 290 is shown. Note that in another embodiment, the shape of the top 290 may be different.

Because of the presence of the oxidation buffer layers 254A and 254B, oxidation in step 208 may be slowed. In addition, growth of the oxide layers 256A and 256B in step 208 may be more uniform and better controlled. As a result, the profile of the sidewalls of the magnetoresistive sensor 270 is smoother and more uniform. Consequently, variations in physical and magnetic track width (TW) of the magnetoresistive sensor 270 may be reduced and magnetic track width better controlled. In addition, the separation between the magnetoresistive sensor 270 and structure(s) adjacent to the oxidation buffer layers 254A and 254B may be more uniform and better controlled. Consequently, yield for the method 200 and performance of the magnetoresistive sensor 270 may be improved.

Figure 11:
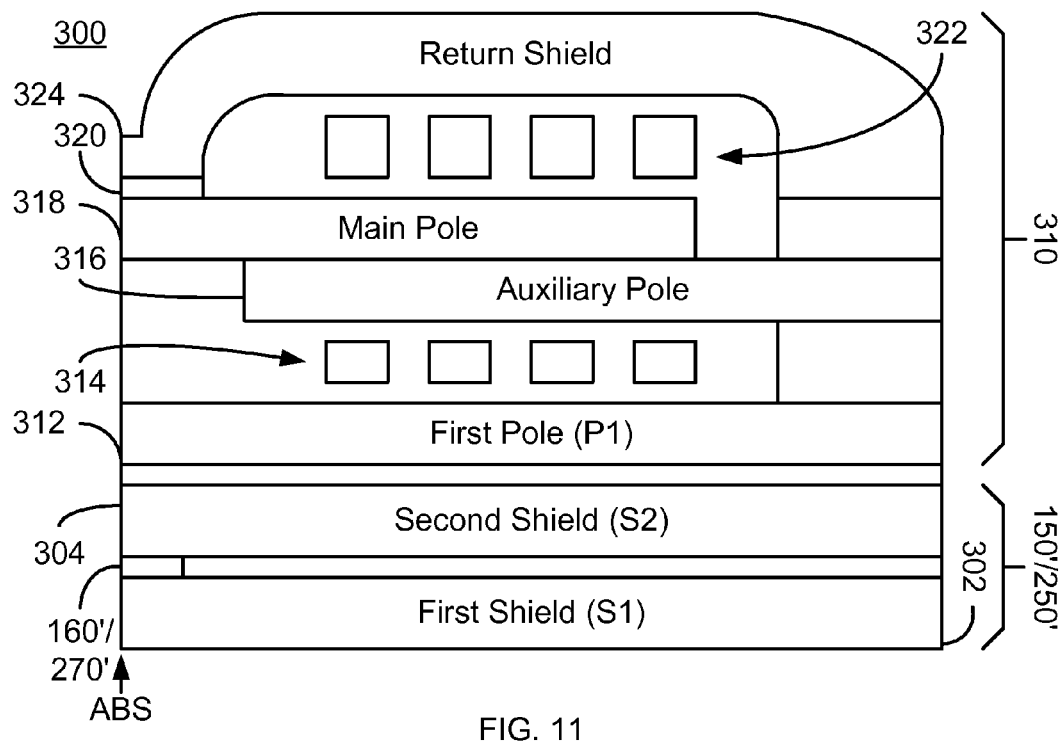
FIG. 11 depicts an exemplary embodiment of a magnetic recording head incorporating a magnetic recording transducer.

FIG. 11 depicts an exemplary embodiment of a magnetic recording head 300 incorporating a magnetic recording transducer. For clarity, the magnetic recording head 300 is not drawn to scale. The magnetic recording head 300 includes a read transducer 150'/250' and a write transducer 310. The read transducer 150'/250' is analogous to the device 150 and read transducer 250 in that the read transducer 150'/250' includes a magnetoresistive structure 160'/270' analogous to the structures 160/270. Although not shown, the read transducer 150'/250' also includes oxidation buffer layers analogous to oxidation buffer layers 154A/154B/254A/254B and oxide layers analogous to oxide layers 156A/156B/256A/256B. The read transducer 150'/250' also includes shields 302 and 304. The magnetic shields 302 and 304 may be composed of a high permeability, soft material, such as NiFe. The write transducer 310 includes a first pole 312, coils 314 and 322, main pole 318, auxiliary pole 316, write gap 320 and return shield 324. In another embodiment, the write transducer 310 may include additional and/or other components.

Because of the presence of the oxidation buffer layers (not shown in FIG. 11) the corresponding oxide layers (not shown in FIG. 11) may be more uniform and better controlled. As a result, the profile of the sidewalls of the magnetoresistive sensor 160'/270' is smoother and more uniform. Consequently, variations in physical and magnetic track width of the magnetoresistive sensor 160'/270' may be reduced and magnetic track width better controlled. In addition, the separation between the magnetoresistive sensor 160'/270' and structure(s) adjacent to the oxidation buffer layers (not shown) may be more uniform and better controlled. Consequently, yield in fabrication and performance of the magnetoresistive sensor 160'/270' may be improved.

We claim:

1. A magnetic transducer comprising:
   a magnetoresistive structure having a plurality of sides;
   at least one oxidation buffer layer covering at least the plurality of sides, the at least one oxidation buffer layer allowing oxidation of the plurality of sides at a reduced oxidation rate less than an oxidation rate of the plurality of sides in an absence of the at least one oxidation buffer layer and greater than zero;
   at least one oxide layer, the at least one oxide layer residing between the plurality of sides and the at least one oxidation buffer layer, the at least one oxide layer including an oxide of the plurality of sides of the magnetoresistive structure; and
   a plurality of hard bias structures adjacent to the at least one oxide layer, the at least one oxide layer residing between the plurality of hard bias structures and the plurality of sides, the at least one oxidation buffer layer being between the at least one oxide layer and the plurality of hard bias structures.

2. The magnetic transducer of claim 1 wherein the at least one oxidation buffer layer includes at least one of aluminum oxide, tantalum oxide, titanium oxide, magnesium oxide, silicon oxide, and silicon nitride.

3. The magnetic transducer of claim 1 wherein the at least one oxidation buffer layer has a thickness of at least two monolayers.

4. The magnetic transducer of claim 1 wherein the at least one oxidation buffer layer has a thickness of not more than seven monolayers.

5. The magnetic transducer of claim 1 wherein the at least one oxidation buffer layer has a thickness of not more than five monolayers.

6. The magnetic transducer of claim 1 wherein the magnetoresistive structure has a top and a bottom, the magnetic transducer further comprising:
   a first contact electrically connected with the bottom of the magnetoresistive structure;
   a second contact electrically connected with the top of the magnetoresistive structure; and
   wherein the magnetic transducer is configured to drive a current between the first contact and the second contact in a current-perpendicular to plane direction.

7. The magnetic transducer of claim 1 wherein the magnetoresistive structure includes a pinned layer, a nonmagnetic spacer layer adjacent to the pinned layer, and a free layer, the nonmagnetic spacer layer residing between the pinned layer and the free layer.

8. The magnetic transducer of claim 7 wherein the nonmagnetic spacer layer is a tunneling barrier layer.

9. The magnetic transducer of claim 7 wherein the nonmagnetic spacer is conductive.

10. A magnetic transducer comprising:
    a magnetoresistive structure having a top, a bottom, and a plurality of sides, the magnetoresistive structure including a pinned layer, a nonmagnetic spacer layer, and a free layer, the nonmagnetic spacer layer residing between the pinned layer and the free layer;
    at least one oxidation buffer layer covering at least the plurality of sides, the at least one oxidation buffer layer having a thickness of at least two and not more than seven monolayers, the at least one oxidation buffer layer allowing oxidation of the plurality of sides at a reduced oxidation rate less than an oxidation rate of the plurality of sides in an absence of the at least one oxidation buffer layer and greater than zero;
    at least one oxide layer, the at least one oxide layer residing between the plurality of sides and the at least one oxidation buffer layer, the at least one oxide layer including an oxide of the plurality of sides of the magnetoresistive structure;
    a plurality of hard bias structures adjacent to the at least one oxide layer, the at least one oxide layer residing between the plurality of hard bias structures and the plurality of sides, the at least one oxidation buffer layer being between the at least one oxide layer and the plurality of hard bias structures;
    a first contact electrically connected with the bottom of the magnetoresistive structure; and
    a second contact electrically connected with the top of the magnetoresistive structure;
    wherein the magnetic transducer is configured to drive current between the first contact and the second contact in a current-perpendicular to plane direction.

11. A disk drive comprising:
    a head including a slider and a magnetic transducer, the magnetic transducer including a magnetoresistive structure having a plurality of sides, at least one oxidation buffer layer covering at least the plurality of sides, at least one oxide layer and a plurality of hard bias structures adjacent to the at least one oxide layer, the at least one oxidation buffer layer allowing oxidation of the plurality sides at a reduced oxidation rate less than an oxidation rate of the plurality of sides in an absence of the at least one oxidation buffer layer and greater than zero, the at least one oxide layer residing between the plurality of hard bias structures and the plurality of sides, the at least one oxide layer residing between the plurality of sides and the at least one oxidation buffer layer, the at least one oxide layer including an oxide of the plurality of sides of the magnetoresistive structure, the at least one oxidation buffer layer being between the at least one oxide layer and the plurality of hard bias structures.

* * * * *